(12) United States Patent
Cao

(10) Patent No.: US 10,971,631 B2
(45) Date of Patent: Apr. 6, 2021

(54) THIN FILM TRANSISTOR AND METHOD OF FABRICATING THE SAME, DISPLAY SUBSTRATE AND METHOD OF FABRICATING THE SAME, DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Binbin Cao, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/536,874

(22) Filed: Aug. 9, 2019

(65) Prior Publication Data

US 2020/0135936 A1 Apr. 30, 2020

(30) Foreign Application Priority Data

Oct. 31, 2018 (CN) .......................... 201811288816.3

(51) Int. Cl.
*H01L 29/786* (2006.01)
*H01L 21/02* (2006.01)
*H01L 27/12* (2006.01)
*H01L 29/417* (2006.01)
*H01L 27/32* (2006.01)

(52) U.S. Cl.
CPC .... *H01L 29/78696* (2013.01); *H01L 21/0262* (2013.01); *H01L 21/02532* (2013.01); *H01L 21/02592* (2013.01); *H01L 21/02667* (2013.01); *H01L 27/124* (2013.01); *H01L 27/1222* (2013.01); *H01L 27/1248* (2013.01); *H01L 27/1274* (2013.01); *H01L 27/3244* (2013.01); *H01L 27/3248* (2013.01);
(Continued)

(58) Field of Classification Search
CPC ...................... H01L 29/78696; H01L 27/3248
See application file for complete search history.

(56) References Cited

U.S. PATENT DOCUMENTS

| | | | | |
|---|---|---|---|---|
| 2007/0007520 A1* | 1/2007 | Seo | ........................ | H01L 27/124 257/48 |
| 2009/0321739 A1* | 12/2009 | Kim | .................. | H01L 29/78696 257/59 |
| 2014/0168556 A1* | 6/2014 | Liu | .................... | H01L 29/66969 349/43 |

* cited by examiner

*Primary Examiner* — Farun Lu
(74) *Attorney, Agent, or Firm* — Nath, Goldberg & Meyer; Joshua B. Goldberg

(57) ABSTRACT

The present application provides a thin film transistor (TFT) and a method of fabricating the same, a display substrate and a method of fabricating the same, and a display device. The TFT includes a substrate, and a source electrode, a drain electrode and an active layer on the substrate. The active layer includes first and second active layers, the first active layer has a carrier mobility greater than that of the second active layer, and the second active layer is closer to the source electrode and the drain electrode than the first active layer. An orthographic projection of the source electrode on the substrate and an orthographic projection of the drain electrode on the substrate at least partially overlap with an orthographic projection of the second active layer on the substrate, respectively, and the first active layer is separated from the source electrode and the drain electrode.

1 Claim, 5 Drawing Sheets

(52) U.S. Cl.
CPC .... *H01L 29/41733* (2013.01); *H01L 29/7866* (2013.01); *H01L 27/3262* (2013.01)

THIN FILM TRANSISTOR AND METHOD OF FABRICATING THE SAME, DISPLAY SUBSTRATE AND METHOD OF FABRICATING THE SAME, DISPLAY DEVICE

CROSS-REFERENCE TO RELATED APPLICATION

This application claims priority to Chinese Patent Application No. 201811288816.3, filed on Oct. 31, 2018, the contents of which are incorporated herein by reference in the entirety.

TECHNICAL FIELD

The present disclosure belongs to the field of display technology, and specifically to a thin film transistor (TFT) and a method of fabricating the same, a display substrate and a method of fabricating the same, and a display device.

BACKGROUND

Due to high mobility and stability of low temperature poly-silicon (LTPS), whose mobility can be tens or even hundreds of times of that of amorphous silicon, LTPS materials can be utilized to form TFTs and applied in display devices.

TFTs include top-gate type TFTs and bottom-gate type TFTs. Compared with a top-gate type TFT, a bottom-gate type TFT is fabricated by a simpler process and has a large cost advantage. The bottom-gate type TFTs generally have either a back-channel-etching type (BCE) structure or an etch-stop-layer type (ESL) structure, depending on a difference in fabrication process. In a bottom-gate TFT of the BCE structure, an etch stop layer can be omitted, and the fabrication process is relatively simple, but it has high leakage current and cannot be well applied in a display panel.

SUMMARY

In an aspect, the present disclosure provides a TFT, which includes a substrate, and a source electrode, a drain electrode and an active layer on the substrate. The active layer includes a first active layer and a second active layer, the first active layer has a carrier mobility greater than that of the second active layer, and the second active layer is closer to the source electrode and the drain electrode than the first active layer. An orthographic projection of the source electrode on the substrate and an orthographic projection of the drain electrode on the substrate at least partially overlap with an orthographic projection of the second active layer on the substrate, respectively, and the first active layer is separated from the source electrode and the drain electrode.

In some embodiments, the orthographic projections of the source electrode and the drain electrode on the substrate fall within the orthographic projection of the second active layer on the substrate.

In some embodiments, the TFT further includes an ohmic contact layer between the source electrode and the second active layer and between the drain electrode and the second active layer.

In some embodiments, the first active layer is made of polysilicon, and the second active layer is made of amorphous silicon.

In some embodiments, the second active layer is at a side of the first active layer away from the substrate, and the source electrode and the drain electrode are at a side of the second active layer away from the first active layer.

In some embodiments, the ohmic contact layer is separated from the first active layer.

In another aspect, the present disclosure provides a display substrate including a TFT on a substrate, the TFT being any one of the above TFTs.

In some embodiments, the display substrate further includes a data line on the substrate, the data line being in the same layer as the source electrode and the drain electrode and having the same material as the source electrode and the drain electrode. The data line is electrically coupled to the source electrode through a connection electrode.

In some embodiments, the display substrate further includes an insulating layer covering a portion of the source electrode, a portion of the drain electrode, and a portion of the data line. The insulating layer includes a first via hole exposing the data line and a second via hole exposing the source electrode. The connection electrode is electrically coupled to the data line and the source electrode through the first via hole and the second via hole.

In some embodiments, the display substrate further includes a pixel electrode at a side of the drain electrode and the insulating layer away from the substrate, the connection electrode being in the same layer as the pixel electrode and having the same material as the pixel electrode. The insulating layer further includes a third via hole exposing the drain electrode, the pixel electrode being electrically coupled to the drain electrode through the third via hole.

In another aspect, the present disclosure provides a display device including any of the above display substrates.

In another aspect, the present disclosure provides a method of fabricating a TFT, including: forming a source electrode, a drain electrode, and an active layer on a substrate. The active layer is formed to include a first active layer and a second active layer, the first active layer having a carrier mobility greater than that of the second active layer. The second active layer is formed closer to the source electrode and the drain electrode than the first active layer, an orthographic projection of the source electrode on the substrate and an orthographic projection of the drain electrode on the substrate at least partially overlap with an orthographic projection of the second active layer on the substrate, respectively, and the first active layer is formed to be separated from the source electrode and the drain electrode.

In another aspect, the present disclosure provides a method of fabricating a display substrate, including: forming an active layer of a TFT on a substrate, the active layer being formed to include a first active layer and a second active layer, the first active layer having a carrier mobility greater than that of the second active layer; forming, by one patterning process, a data line and a source electrode and a drain electrode of the TFT on the substrate, the second active layer being closer to the source electrode and the drain electrode than the first active layer, an orthographic projection of the source electrode on the substrate and an orthographic projection of the drain electrode on the substrate at least partially overlapping with an orthographic projection of the second active layer on the substrate, respectively, and the first active layer being formed to be separated from the source electrode and the drain electrode; forming an insulating layer on the substrate on which the data line, the source electrode, and the drain electrode have been formed, and forming, by a patterning process, a first via hole on the insulating layer to expose the data line, and a second via hole on the insulating layer to expose the source electrode; and forming, by a patterning process, a connection electrode on the substrate on which the insulating layer has been formed, the connection electrode being electrically coupled to the data line and the source electrode through the first via hole and the second via hole.

DETAILED DESCRIPTION

To make those skilled in the art better understand the technical solutions of the present disclosure, the present disclosure will be further described in detail below in conjunction with the accompanying drawings and specific implementations.

The present disclosure provides a TFT, which can be a top-gate type TFT or a bottom-gate type TFT. The TFT may include a substrate, and a gate electrode, a gate insulation layer, a source electrode, a drain electrode, an active layer and the like on the substrate. The active layer includes a first active layer and a second active layer, the first active layer has a carrier mobility greater than that of the second active layer, and the second active layer is closer to the source electrode and the drain electrode than the first active layer, so as to reduce leakage current of the TFT by providing the second active layer. Specifically, the first active layer is made of polysilicon, and the second active layer is made of amorphous silicon.

Figure 1:
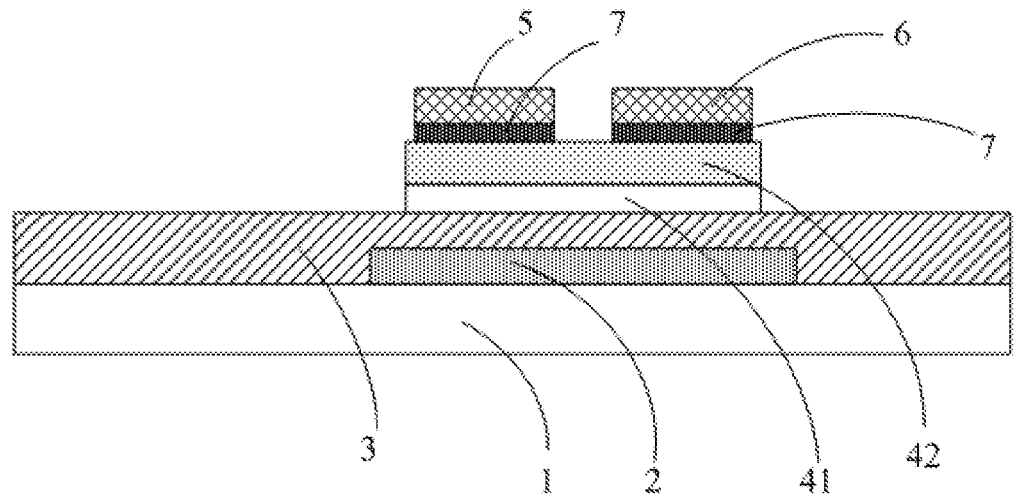
FIG. 1 is a cross sectional view of a TFT according to an embodiment of the present disclosure.

As illustrated in FIG. 1, a bottom-gate type TFT is taken as an example to illustrate a TFT according to an embodiment of the present disclosure. Specifically, as illustrated in FIG. 1, in a TFT according to the present embodiment, a gate electrode 2, a gate insulation layer 3, a first active layer 41, a second active layer 42, and a source electrode 5 and a drain electrode 6 are sequentially disposed in a direction away from a substrate 1.

In particular, in a TFT according to an embodiment of the present disclosure, an orthographic projection of the source electrode 5 on the substrate 1 and an orthographic projection of the drain electrode 6 on the substrate 1 at least partially overlap with an orthographic projection of the second active layer 42 on the substrate, respectively, and the first active layer 41 is separated from the source electrode 5 and the drain electrode 6. In some embodiments, the orthographic projections of the source electrode 5 and the drain electrode 6 on the substrate 1 fall within the orthographic projection of the second active layer 42 on the substrate 1.

As illustrated in FIG. 1, in a TFT according to an embodiment of the present disclosure, the orthographic projection of the source electrode 5 on the substrate 1 falls within the orthographic projection of the second active layer 42 on the substrate 1, and the orthographic projection of the drain electrode 6 on the substrate 1 also falls within the orthographic projection of the second active layer 42 on the substrate 1, and it could be understood that, the orthographic projections of the source electrode 5 and the drain electrode 6 on the substrate 1 are separated from and do not overlap with each other. The source electrode 5 and the drain electrode 6 are not in direct contact with the first active layer 41 below the second active layer 42. In other words, the first active layer 41 is separated from the source electrode 5 and the drain electrode 6. By this arrangement, when the TFT operates, current flows from the source electrode 5 into the second active layer 42, and then, due to the fact that the carrier mobility of the first active layer 41 is greater than that of the second active layer 42, the current continues to flow into the first active layer 41 and then into the drain electrode 6 via the second active layer 42. That is, by making the source electrode 5 and the drain electrode 6 not in contact with the first active layer 41, there is only a current path of the source electrode 5—the second active layer 42—the first active layer 41—the second active layer 42—the drain electrode 6, but not a current path of the source electrode 5—the first active layer 41—the drain electrode 6 in the TFT according to an embodiment of the present disclosure, thereby avoiding the problem of high leakage current of the TFT caused by the current path of the source electrode 5—the first active layer 41—the drain electrode 6.

In some embodiments, the TFT further includes an ohmic contact layer 7 between the source electrode 5 and the second active layer 42 and between the drain electrode 6 and the second active layer 42. The ohmic contact layer 7 can reduce the contact resistance between the second active layer 42 and the source and drain electrodes 5 and 6, thereby improving the performance of the TFT. It could be understood that the ohmic contact layer 7 should be located only between the source electrode 5 and the second active layer 42 and between the drain electrode 6 and the second active layer 42, and not in direct contact with the first active layer 41 (in other words, the ohmic contact layer 42 is separated from the first active layer 41), to ensure that the TFT does not have a current path of the source electrode 5—the ohmic contact layer 7—the first active layer 41—the ohmic contact layer 7—the drain electrode 6, thereby ensuring that the leakage current of the TFT is not too large.

It should be noted that the TFT in an embodiment of the present disclosure is not limited to the bottom-gate type TFT, but may be other types of TFTs, such as a top-gate type TFT, as long as the structure of the TFT has the following features: the orthographic projection of the source electrode on the substrate and the orthographic projection of the drain electrode on the substrate at least partially overlap with the orthographic projection of the second active layer on the substrate, respectively, and the first active layer is separated from the source electrode and the drain electrode.

Figure 2:
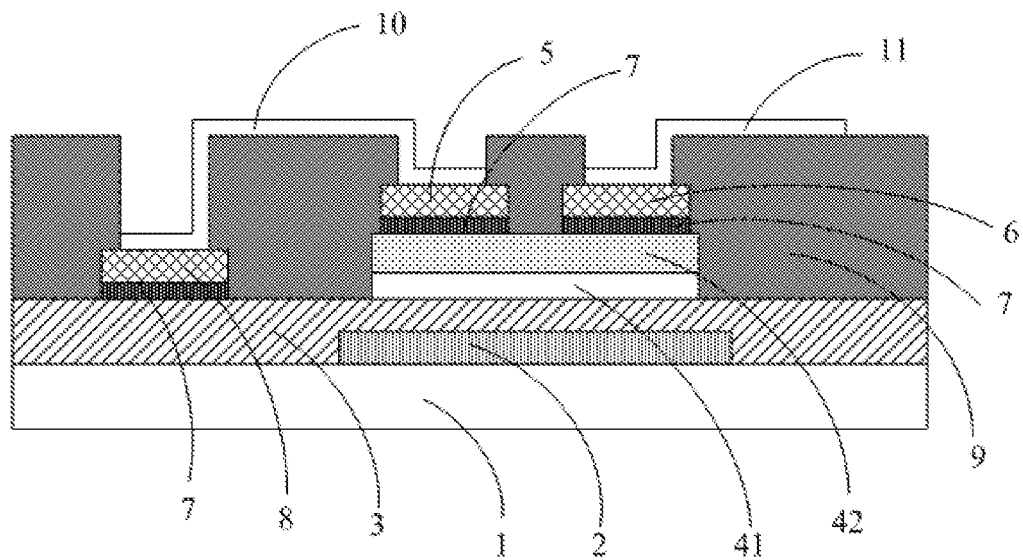
FIG. 2 is a cross sectional view of a display substrate according to an embodiment of the present disclosure.

As illustrated in FIG. 2, the present disclosure provides a display substrate including a TFT disposed on the substrate 1 and a data line 8 electrically coupled to the source electrode 5 of the TFT. The TFT can be any one of the TFTs described herein. Therefore, the display substrate according to an embodiment of the present disclosure has a small leakage current and good display performance.

Specifically, in the display substrate according to an embodiment of the present disclosure, the data line 8 is insulated from the TFT, and the data line 8 and the TFT are electrically coupled through a connection electrode 10. As illustrated in FIG. 2, an insulating layer 9 is disposed over the layer where the source electrode 5 is located, and covers a portion of the source electrode 5. The insulating layer 9 includes a first via hole provided therein and exposing the data line 8. The first via hole is provided with the connection electrode 10 therein, one end of the connection electrode 10 is coupled to the source electrode 5, and the other end of the connection electrode 10 is coupled to the data line 8, thereby realizing the electrical connection between the data line 8 and the source electrode 5 of the TEL In some embodiments, as illustrated in FIG. 2, the data line 8, the source electrode 5 and the drain electrode 6 of the TFT are all located below the insulating layer 9, and the insulating layer 9 covers a portion of the data line 8, a portion of the source electrode 5, and a portion of the drain electrode 6. The insulating layer 9 includes a second via hole provided therein and exposing the source electrode 5. The connection electrode 10 is electrically coupled to the data line 8 and the source electrode 5 through the first and second via holes.

In some embodiments, the data line 8 is in the same layer as the source electrode 5 and the drain electrode 6 and has the same material as the source electrode 5 and the drain electrode 6. That is, the data line 8, the source electrode 5 and the drain electrode 6 may be formed by one patterning process to simplify the fabrication process of the display substrate. Specifically, the data line 8, the source electrode 5, and the drain electrode 6 may be made of a metal such as copper, aluminum, or the like.

In some embodiments, the display substrate according to an embodiment of the present disclosure further includes a pixel electrode 11 at a side of the insulating layer 9 and the drain electrode 6 away from the substrate 1. The insulating layer 9 further includes a third via hole provided therein and exposing the drain electrode 6, and the pixel electrode 11 is electrically coupled to the drain electrode 6 through the third via hole. The connection electrode 10 may be in the same layer as the pixel electrode 11 and have the same material as the pixel electrode 11, that is, the pixel electrode 11 and the connection electrode 10 may be formed by one patterning process. Specifically, the connection electrode 10 and the pixel electrode 11 may be made of ITO (indium tin oxide), IZO (indium zinc oxide), IGZO (indium gallium zinc oxide), InGaSnO (indium gallium tin oxide) or the like.

The present disclosure provides a display device including any of the display substrates described herein.

The display device may be a liquid crystal display device or an electroluminescence display device, such as an electronic paper, an OLED panel, a mobile phone, a tablet computer, a television, a display, a notebook computer, a digital photo frame, a navigator, and the like, or any product or component having a display function.

The display device according to the present embodiment has a small leakage current and good display quality.

The present disclosure provides a method of fabricating a TFT. FIGS. 3 to 6 illustrate a method of fabricating a TFT according to an embodiment of the present disclosure by taking a bottom-gate type TFT in which an active layer is located at a side of the source electrode 5 and the drain electrode 6 close to the substrate 1 as an example. The method of manufacturing the TFT includes steps S1 to S4.

In step S1, the gate electrode 2 is formed by a patterning process on the substrate 1.

Figure 3:
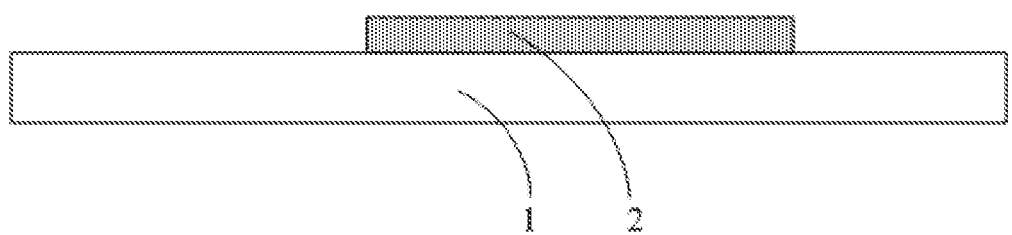
FIG. 3 is a schematic diagram illustrating the forming of a gate electrode in a method of fabricating a TFT according to an embodiment of the present disclosure.

As illustrated in FIG. 3, in this step, a gate metal film may be formed by sputtering, thermal evaporation, plasma enhanced chemical vapor deposition, low pressure chemical vapor deposition, atmospheric pressure chemical vapor deposition or electron cyclotron resonance chemical vapor deposition, and a pattern of the gate electrode 2 may be formed by an etching process.

In step S2, a gate insulation layer 3 is formed on the substrate 1.

Figure 4:
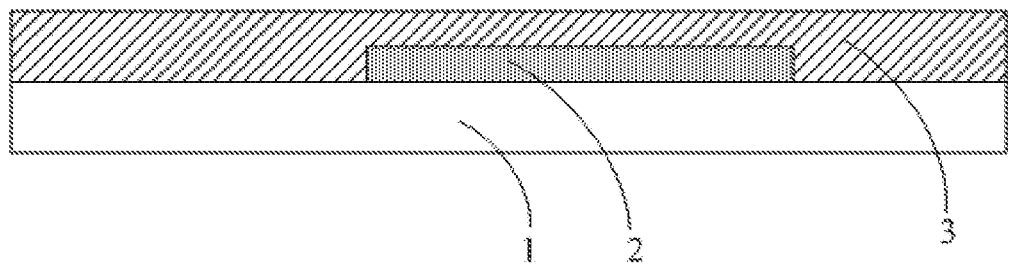
FIG. 4 is a schematic diagram illustrating the forming of a gate insulation layer in a method of fabricating a TFT according to an embodiment of the present disclosure.

As illustrated in FIG. 4, in this step, the gate insulation layer 3 may be formed on the substrate 1 on which the gate electrode 2 has been formed, by plasma enhanced chemical vapor deposition, low pressure chemical vapor deposition, atmospheric pressure chemical vapor deposition, electron cyclotron resonance chemical vapor deposition or sputtering.

In step S3, a pattern of an active layer is formed on the substrate 1. The active layer includes a first active layer 41 and a second active layer 42, the carrier mobility of the first active layer 41 is greater than the carrier mobility of the second active layer 42, and the first active layer 41 is closer to the gate insulation layer 3 than the second active layer 42.

Figure 5:
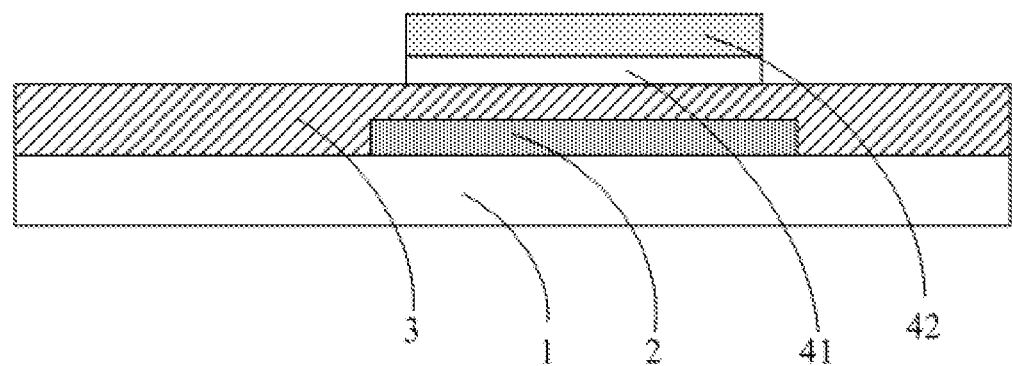
FIG. 5 is a schematic diagram illustrating the forming of an active layer in a method of fabricating a TFT according to an embodiment of the present disclosure.

As illustrated in FIG. 5, in the TFT formed in an embodiment of the present disclosure, the second active layer 42 is closer to the layer where the source electrode 5 and the drain electrode 6 are located than the first active layer 41. In some embodiments, the first active layer 41 is made of polysilicon, and the second active layer 42 is made of amorphous silicon.

Specifically, the step S3 may include steps S31 and S32.

In step S31, a polysilicon material layer and an amorphous silicon material layer are sequentially formed on the substrate 1.

Specifically, an amorphous silicon material layer may be formed on the substrate 1, by a deposition method such as plasma enhanced chemical vapor deposition, low pressure chemical vapor deposition, etc., and the amorphous silicon material layer is crystallized to form a polysilicon material layer. Thereafter, an amorphous silicon material layer is formed on the polysilicon material layer by a deposition process again.

In some embodiments, the crystallization method may include excimer laser crystallization, metal induced crystallization or solid phase crystallization, to convert the amorphous silicon material layer into the polysilicon material layer (p-Si).

In step S32, the first active layer 41 and the second active layer 42 are formed by one etching process.

The polysilicon material layer and the amorphous silicon material layer formed in the step S31 are processed by one patterning process, thereby forming a pattern including the first active layer 41 and the second active layer 42. In this step, a photoresist layer may be formed on the amorphous silicon layer, the photoresist layer may be exposed and developed, and then etched to form a pattern including the active layer.

In step S4, patterns of the source electrode 5 and the drain electrode 6 is formed on the substrate 1 by a patterning process.

Figure 6:
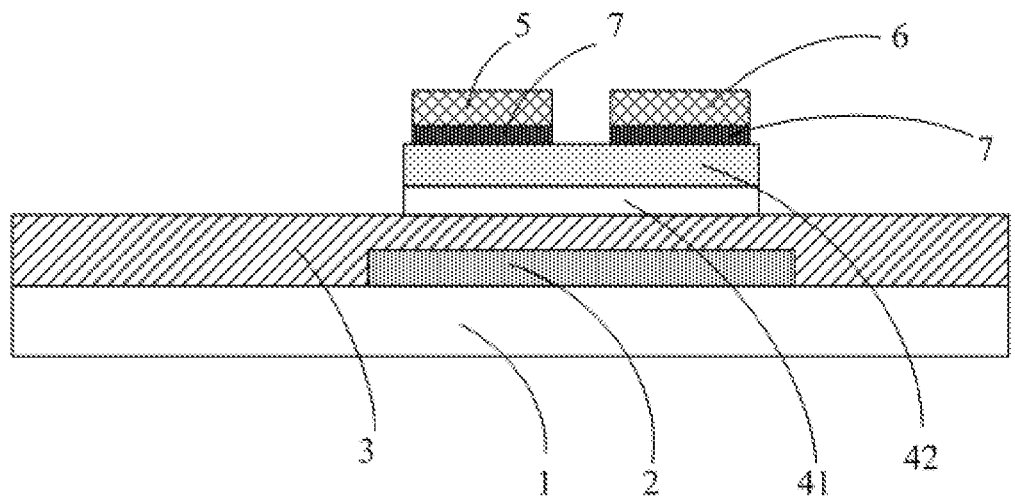
FIG. 6 is a schematic diagram illustrating the forming of a source electrode and a drain electrode in a method of fabricating a TFT according to an embodiment of the present disclosure.

As illustrated in FIG. 6, this step includes forming the source electrode 5 and the drain electrode 6, respectively, in a region corresponding to the second active layer 42 on the substrate 1 by a patterning process. Specifically, in this step, a source/drain metal film may be formed on the substrate 1 by sputtering, thermal evaporation, chemical vapor deposition, or the like, and then patterns including the source electrode 5 and the drain electrode 6 are formed at the same time, by processes such as film formation, exposure, development, wet or dry etching, and the like.

In the TFT formed in this embodiment, the orthographic projection of the source electrode 5 on the substrate 1 and the orthographic projection of the drain electrode 6 on the substrate 1 at least partially overlap with the orthographic projection of the second active layer 42 on the substrate 1, respectively, and the first active layer 41 are separated from the source electrode 5 and the drain electrode 6.

In some embodiments, the orthographic projections of the source electrode 5 and the drain electrode 6 on the substrate 1 both fall into the orthographic projection of second active layer 42 on the substrate 1. Since the source electrode 5 and the drain electrode 6 are not in contact with the first active layer 41 below the second active layer 42, there is no current path of the source electrode 5—the first active layer 41—the drain electrode 6, thereby avoiding the problem of high leakage current of the TFT caused by such a current path.

As illustrated in FIGS. 3 to 9, the present disclosure provides a method of fabricating a display substrate. The display substrate includes a TFT, and a data line 8 coupled to the source electrode 5 of the TFT.

In the method of fabricating the display substrate according to this embodiment, the method of fabricating the TFT may refer to the method of fabricating the TFT described above. For a method of fabricating the data line 8, reference may be made to the fabrication steps of the source and drain electrodes 5 and 6 in the method of fabricating the TFT described above.

Figure 7:
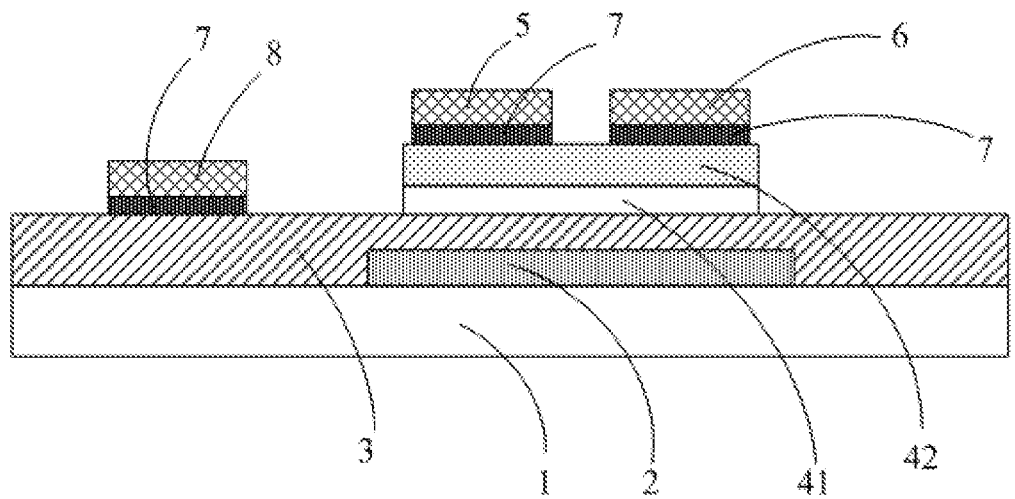
FIG. 7 is a schematic diagram illustrating the forming of a data line in a method of fabricating a display substrate according to an embodiment of the present disclosure.

In some embodiments, as illustrated in FIG. 7, the data line 8 and the source electrode 5 and the drain electrode 6 of the TFT may be formed by one patterning process. That is, in the fabrication of the source electrode 5 and the drain electrode 6, the data line 8, the source electrode 5, and the drain electrode 6 may be formed on the substrate 1 at one time by the design of mask plate, to simplify the fabrication process of the display substrate.

In this embodiment, after forming the TFT and the data line 8, the method further includes steps S5 and S6.

In step S5, an insulating layer 9 is formed on the substrate 1 on which the data line 8 and the TFT have been formed, and by a patterning process, a first via hole is formed at a position of the insulating layer 9 corresponding to the data line 8, and a second via hole is formed at a position of the insulating layer 9 corresponding to the source electrode 5.

Figure 8:
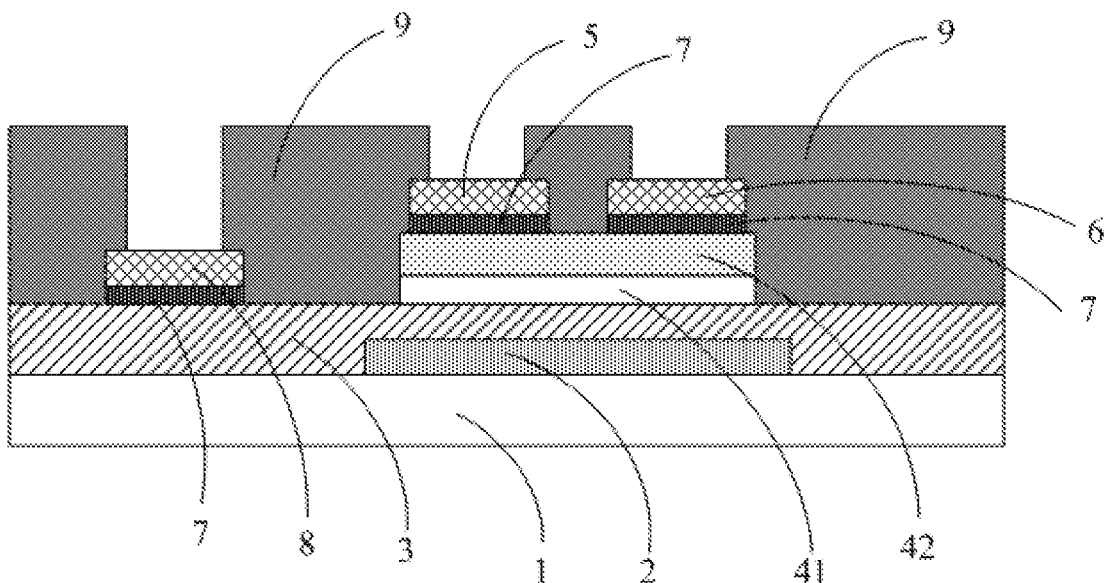
FIG. 8 is a schematic diagram illustrating the forming of an insulating layer in a method of fabricating a display substrate according to an embodiment of the present disclosure.

As illustrated in FIG. 8, the insulating layer 9 may be deposited by plasma enhanced chemical vapor deposition, low pressure chemical vapor deposition, atmospheric pressure chemical vapor deposition or electron cyclotron resonance chemical vapor deposition, in the same manner as the deposition of the gate insulation layer 3. By an etching process, a first via hole may be formed at a position of the insulating layer 9 corresponding to the data line 8, and a second via hole may be formed at a position of the insulating layer 9 corresponding to the source electrode 5.

In step S6, the connection electrode 10 is formed by a patterning process on the substrate 1 on which the above steps have been performed, and the connection electrode 10 is electrically coupled to the data line 8 and the source electrode 5 through the first via hole and the second via hole.

Figure 9:
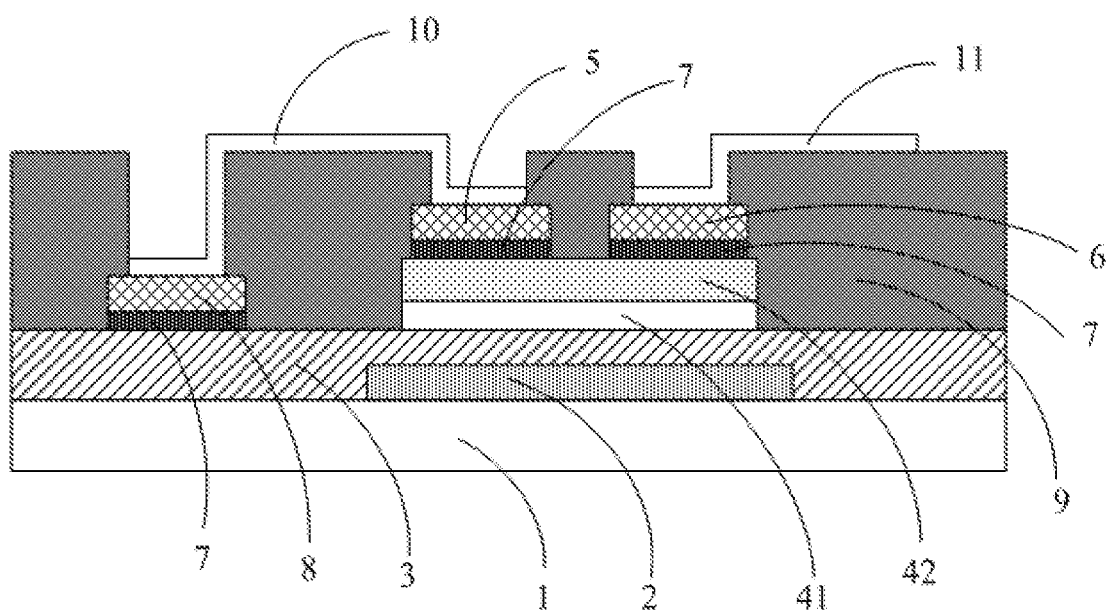
FIG. 9 is a schematic diagram illustrating the forming of a connection electrode and a pixel electrode in a method of fabricating a display substrate according to an embodiment of the present disclosure.

Specifically, as illustrated in FIG. 9, in this step, a conductive metal film may be deposited by sputtering, thermal evaporation, chemical vapor deposition, or the like. A pattern of the connection electrode 10 is then formed by an etching process. The conductive metal film may be made of ITO, IZO, IGZO, InGaSnO or the like.

In the above step S5, a third via hole may be further formed at a position of the insulating layer 9 corresponding to the drain electrode 6, and in the above step S6, the pixel electrode 11 and the connection electrode 10 are formed at the same time by one patterning process, and the pixel electrode 11 is coupled to the drain electrode 6 of the TFT through the third via hole.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A method of fabricating a display substrate, comprising:
   forming an active layer of a thin film transistor (TFT) on a substrate, the active layer being formed to comprise a first active layer and a second active layer, a carrier mobility of the first active layer being greater than a carrier mobility of the second active layer;
   forming, by one patterning process, a data line and a source electrode and a drain electrode of the TFT on the substrate, the second active layer being closer to the source electrode and the drain electrode than the first active layer, an orthographic projection of the source electrode on the substrate and an orthographic projection of the drain electrode on the substrate at least partially overlapping with an orthographic projection of the second active layer on the substrate, respectively, and the first active layer being formed to be separated from the source electrode and the drain electrode;
   forming an insulating layer on the substrate on which the data line, the source electrode, and the drain electrode have been formed, and forming, by a patterning process, a first via hole in the insulating layer to expose the data line, and a second via hole in the insulating layer to expose the source electrode; and
   forming, by a patterning process, a connection electrode on the substrate on which the insulating layer has been formed, the connection electrode being electrically coupled to the data line and the source electrode through the first via hole and the second via hole.

* * * * *